United States Patent
Buckley et al.

(10) Patent No.: US 8,427,961 B2
(45) Date of Patent: Apr. 23, 2013

(54) INFORMATION ENCODING ON A CODEWORD IN WIRELESS COMMUNICATION NETWORKS

(75) Inventors: Michael E. Buckley, Grayslake, IL (US); Jeffrey C. Smolinski, Schaumburg, IL (US); Kenneth A Stewart, Grayslake, IL (US); Raja S Bachu, Des Plaines, IL (US)

(73) Assignee: Motorola Mobility LLC, Libertyville, IL (US)

( * ) Notice: Subject to any disclaimer, the term of this patent is extended or adjusted under 35 U.S.C. 154(b) by 1556 days.

(21) Appl. No.: 11/419,177

(22) Filed: May 18, 2006

(65) Prior Publication Data

US 2007/0268834 A1 Nov. 22, 2007

(51) Int. Cl.
  *H04J 3/14* (2006.01)
  *H03M 13/00* (2006.01)

(52) U.S. Cl.
  USPC .......................................... 370/242; 714/758

(58) Field of Classification Search ................... 714/752, 714/762, 755, 758, 800, 759; 370/242
  See application file for complete search history.

(56) References Cited

U.S. PATENT DOCUMENTS

| | | | | |
|---|---|---|---|---|
| 5,383,204 A * | 1/1995 | Gibbs et al. | | 714/758 |
| 5,384,782 A | 1/1995 | Elms | | |
| 5,491,700 A * | 2/1996 | Wright et al. | | 714/759 |
| 6,357,030 B1 | 3/2002 | Demura et al. | | |
| 6,396,423 B1 | 5/2002 | Laumen et al. | | |
| 6,499,128 B1 * | 12/2002 | Gerlach et al. | | 714/755 |
| 6,640,327 B1 | 10/2003 | Hallberg | | |
| 6,754,871 B1 * | 6/2004 | Pines et al. | | 714/762 |
| 7,228,485 B1 * | 6/2007 | Wu et al. | | 714/758 |
| 7,240,270 B2 | 7/2007 | Bellier et al. | | |
| 2002/0166091 A1 * | 11/2002 | Kidorf et al. | | 714/752 |
| 2005/0097432 A1 * | 5/2005 | Obuchi et al. | | 714/800 |

FOREIGN PATENT DOCUMENTS

| | | |
|---|---|---|
| EP | 1161016 A2 | 5/2001 |
| JP | 05219025 A1 | 8/1993 |
| JP | 2000-181807 A | 6/2000 |
| JP | 2002-527982 A | 8/2002 |
| JP | 2005-509326 A | 4/2005 |

OTHER PUBLICATIONS

3GPP TS 44.060 V6.16.0 (Jan. 2006) Technical Specification 3rd Generation Partnership Project; Technical Specification Group GSM/EDGE Radio Access Network; General Packet Radio Service (GPRS); Moblie Station (MS)—Base Station System (BSS) interface; Radio link Control/Medium Access Control (RLC/MAC) protocol (Release 6).
3GPP TSG GERAN#29 GP-060771 San Jose Del Cabo, Mexico Agenda Item 6.1 24—Apr. 28, 2006 Source: Nokia Latency improvements due to TTI Reduction.

(Continued)

*Primary Examiner* — Mark Rinehart
*Assistant Examiner* — Gbemileke Onamuti

(57) ABSTRACT

A wireless communication network entity 400 and a method therein wherein data is encoded using an error correcting code to form a first codeword, for example, a cyclic redundancy code, including redundancy. A second codeword is generated by encoding additional data on a portion of the first codeword, wherein the portion of the first codeword on which the additional data is encoded being within an error correction capability of the first codeword.

10 Claims, 3 Drawing Sheets

OTHER PUBLICATIONS

3GPP TSG-GERAN #29 Tdoc GP-060780 San Jose del Cabo, Mexico, Apr. 24-28, 2006 Source: Siemens Reduced RLC Window Size for delay-sensitive applications.

3GPP TSG-GERAN #29 Tdoc GP-060781 San Jose del Cabo, Mexico, Apr. 24-28, 2006 Source: Siemens Proposal for a 5 ms TTI solution.

3GPP TR 45.912 V0.5.0 (yyyy-mm) Technical Report 3rd Generation Partnership Project; Technical Specification Group GSM/EDGE Radio Access Network: Feasibility study for evolved GSM/EDGE Radio Access Network (GERAN) (Release 7).

U.S. Appl. No. 11/276,981, filed Mar. 20, 2006, Brian Classon.

Japanese Patent Office, Office Action for Japansese Patent Application No. 2009-511127 dated Sep. 27, 2011, 5 pages.

Mexican Patent Office, "Second Office Action" for Mexican Application No. MX/a/20081014628 Nov. 22, 2010, 4 pages.

European Patent Office, Extended Search Report for European Patent Application No. 07758393.8 dated Jul. 3, 2012, 9 pages.

3GPP TS 05.03 V8.9.0 (Jan. 2005) 3rd Generation Partnership Project; Technical Specification Group GSM/EDGE Radio Access Network; Channel Coding (Release 1999) 115 pages.

* cited by examiner

INFORMATION ENCODING ON A CODEWORD IN WIRELESS COMMUNICATION NETWORKS

FIELD OF THE DISCLOSURE

The present disclosure relates generally to wireless communications and, more particularly, to encoding additional information onto a portion of a codeword formed by encoding information with an error correcting code, for example, a cyclic redundancy code, for communication among entities in wireless communication networks, corresponding entities and methods.

BACKGROUND

Low latency is necessary to provide a positive user experience for Voice over Internet Protocol (VoIP), Push-to-transmit over Cellular (PoC) and videophone application based services. According to the International Telecommunications Union (ITU), an intra-regional VoIP call, for example, a call within Africa, Europe, North America, etc., should experience single direction latency on the order of 150 msec. An inter-regional VoIP call should experience single direction latency on the order of 200-300 msec.

Hybrid Automatic Repeat reQuest (HARQ) is known generally. EGPRS currently existing within GSM enables HARQ by periodic polling. The polling mechanism, however, is a fundamental cause of latency. In section 10 of the GERAN Evolution Feasibility Study 45.912, ACK/NACK messages are enabled either through polling and/or continuous bi-directional data flow. Thus where there is no continuous bi-directional data flow, low latency can only be guaranteed by continuous polling. However, continuous polling is spectrally inefficient and does not allow seamless interoperability with legacy mobile stations. Currently, wireless communication network operators must disable HARQ completely or operate HARQ in a spectrally inefficient manner to support low latency applications such as voice over IP or real time video streaming.

For a mobile to mobile VoIP call, existing EGPRS protocols with Automatic Repeat Request (ARQ) have latency on the order of 420 msec for each uplink or downlink. This latency exceeds the 200-300 msec latency for an inter-regional VoIP call and is well beyond the 150 msec latency for an intra-regional VoIP call.

The various aspects, features and advantages of the disclosure will become more fully apparent to those having ordinary skill in the art upon careful consideration of the following Detailed Description and the accompanying drawings described below. The drawings may have been simplified for clarity and are not necessarily drawn to scale.

DETAILED DESCRIPTION

Figure 1:
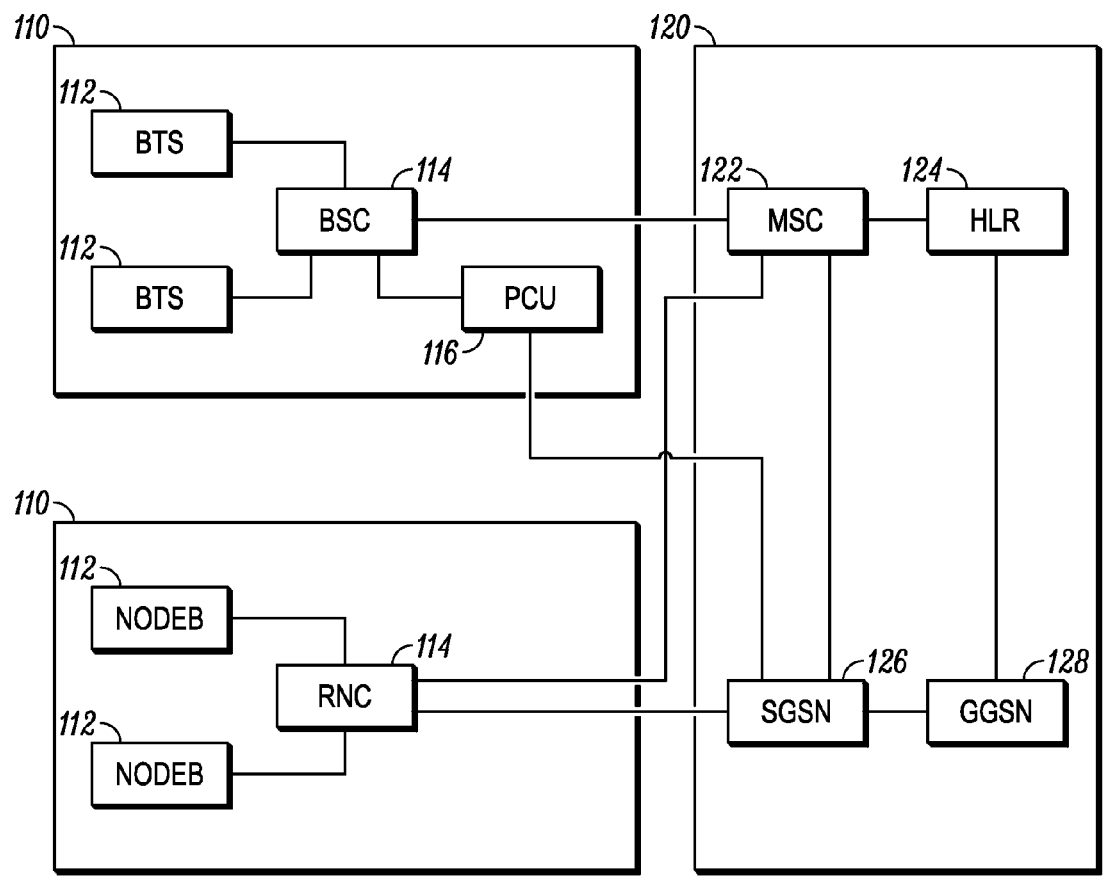
FIG. 1 is a wireless communication network.

In FIG. 1, the exemplary wireless communication system 100 comprises one or more radio access networks 110 communicably coupled to a core network 120. Exemplary cellular communication networks include 3GPP GERAN based networks, for example, GSM/EGPRS and Enhanced Data-rates for GSM (or Global) Evolution (EDGE) networks, and 3rd Generation 3GPP WCDMA networks among other existing and future generation cellular communication networks.

In FIG. 1, the access network generally comprises multiple base stations 112 serving cellular areas distributed over corresponding geographical regions, wherein each base station may consist of one or more cells or sectors. Generally, one or more base stations are communicably coupled to a corresponding controller 114. The base stations and controllers may be referred to differently depending upon the network protocol implemented. For example, in GSM networks, the base station 110 is referred to as a base transceiver station (BTS) and the controller is a Base Station Controller (BSC). Some GSM networks also include a Packet Control Unit (PCU) 116. In UMTS networks, the base station is referred to as a Node B and the controller is referred to as a Radio Network Controller (RNC).

In FIG. 1, the core network 120 comprises a mobile switching center (MSC) 122 communicably coupled to the controller, for example, the BSC and RNC. The MSC is typically communicably coupled to a Public Switches Telephone Network (PSTN) and/or an Integrated Services Digital Network (ISDN), which is a PSTN utilizing Signaling System Number 7 (SS7) interfaces (common channel telecommunications packet switching). The core network includes a Home Location Register (HLR) 124 and a Visitor Location Register (VLR), which may be located in the MSC or in some other infrastructure entity. In networks with packet service, the core network includes a Serving General packet radio support Serving Node (SGSN) 126 communicably coupled to the PCU 116 and/or to the RNC 114. In GSM networks, the PCU provides packet support. The SGSN is typically communicably coupled to a Gateway GPRS Support node (GGSN) 128, which connects to other packet data networks, for example, the Internet.

The base stations communicate with mobile terminals 102, which may be referred to as Mobile Stations (MS) or User Equipment (UE), dependent upon the protocol, to schedule radio resources and to receive and/or transmit data using available radio resources. The wireless communication system 100 may also comprises other infrastructure entities for performing management functionality including data routing, admission control, subscriber billing, terminal authentication, etc., which may be controlled by other network entities. These entities are not illustrated but are known generally by those having ordinary skill in the art.

Figure 2:
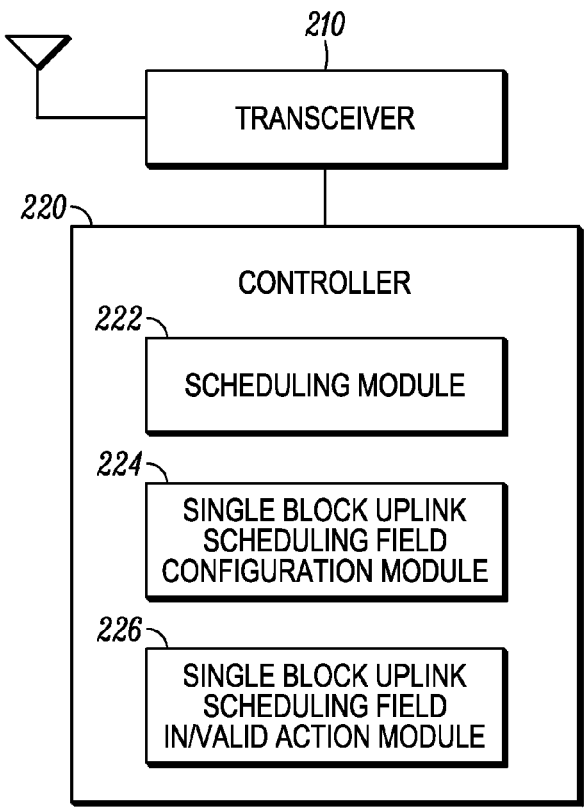
FIG. 2 is a wireless communication network infrastructure entity.

In one embodiment illustrated in FIG. 2, a wireless communication infrastructure entity 200, for example, a base station or packet control unit (PCU) comprises a transceiver 210 for communicating with schedulable wireless terminals in the network. The infrastructure entity includes a controller 220 communicably coupled to the transceiver. The infrastructure entity performs scheduling functions including the assignment of radio resources to wireless terminals in the network. For example, the infrastructure entity may assign one or more time slots to the wireless terminals. More generally, the assigned radio resources may be a time-frequency resource. In one embodiment, the controller includes a scheduling module 222 or other logical entity for performing scheduling. The scheduling module is readily implemented in software.

In FIG. 2, the wireless communication infrastructure entity 200 sends non-scheduling information, for example, acknowledgement information, to the wireless communication terminal on a single block uplink scheduling field in a downlink block. Acknowledgment information includes, for example, ACK and NACK information, which is sent to the terminal based on whether information is received from the first wireless communication terminal on one or more of its assigned time slots. In one embodiment, the controller includes a single block uplink scheduling field configuration module 224 or other logical entity for configuring the single block uplink scheduling field of the downlink block with non-scheduling information. The single block uplink scheduling field configuration module is readily implemented in software. After configuring the single block uplink scheduling field, the transceiver transmits the non-scheduling information to the wireless terminal in a downlink block.

In one embodiment specific to GPRS/EDGE applications, the network infrastructure entity transmits the non-scheduling information in an unused Relative Reserved Block Period (RRBP) field. In GERAN, the RRBP field is a 2-bit data field in a downlink RLC/MAC block. According to this embodiment, the single block uplink scheduling field of the downlink block is the RRBP field. The RRBP value normally specifies a single uplink block in which the mobile station transmits either a packet control acknowledgment message or a packet access control channel block to the network as specified in 3GPP TS 44.060 V6.16.0, 10.4.5. According to the present disclosure the RRBP field is used, unconventionally, to communicate non-scheduling information, for example, acknowledgement information, to a wireless terminal.

In GPRS/EDGE (GERAN) applications, generally, the network infrastructure entity may validate or invalidate the RRBP field. The Supplementary/Polling (S/P) Bit is used to indicate whether the RRBP field is valid or not valid in GPRS applications, as disclosed 3GPP TS 44.060 V6.16.0 10.4.4. When the S/P Bit is set to "0", RRBP is not valid and when set to "1" RRBP is valid. In EDGE applications, the ES/P field is used to indicate whether the RRBP field is valid or not valid and what fields the next uplink control block shall contain. In FIG. 2, in one embodiment, the network infrastructure entity controller includes a single block uplink scheduling field invalidation/validation module or other logical entity 226 for validating or invalidating the single block uplink scheduling field, for example, the RRBP field, of the downlink block. The single block uplink scheduling field invalidation/validation module is typically implemented in software.

In GERAN based networks including legacy and non-legacy wireless communication terminals, the network infrastructure entity may validate the RRBP field for legacy terminals in the network. A legacy terminal does not comply with the High Speed Hybrid Automatic Repeat Request (HS-HARQ) protocol and a non-legacy terminal does comply with HS-HARQ.

In one embodiment where the RRBP is validated for legacy terminals in GERAN networks, the network infrastructure entity transmits a downlink block having an RRBP field that includes ACK information encoded as an available minimal scheduling delay for a non-legacy terminal. In another embodiment where the RRBP is validated for legacy terminals in GERAN networks, the network infrastructure entity transmits a downlink block having an RRBP field that includes NACK information encoded as available scheduling delays excluding a minimal scheduling delay for a non-legacy terminal.

In some embodiments where the RRBP is validated for legacy terminals in GERAN networks, the network infrastructure entity transmits a downlink block having an RRBP field that includes acknowledgement information for a non-legacy terminal and the RRBP field includes uplink scheduling information for a legacy terminal.

In GERAN, the RRBP field is a 2-bit data field. In one GERAN application where the RRBP field is valid for legacy terminals, one bit of the 2-bit data field includes acknowledgement information for a first uplink block and the other bit of the 2-bit data field includes acknowledgement information for a second, different uplink block. The encoding of the 2 bits of acknowledgement data results in the legacy mobile interpreting the RRBP field as one of four possible delay values. In another GERAN application where the RRBP field is valid for legacy terminals, one bit of the 2-bit data field includes acknowledgement information for at least two different uplink data blocks and the other bit of the 2-bit data field includes acknowledgement information for one uplink data block different than the two different uplink data blocks.

In embodiments where the RRBP is invalidated for legacy terminals in GERAN networks, the network infrastructure entity transmits a downlink block having an RRBP field that includes acknowledgement information, for example, ACK and/or NAK information, for a non-legacy terminal. In one particular application where the RRBP is a 2-bit data field, one bit of the RRBP field includes acknowledgement information for a first uplink block and the other bit of the RRBP field includes acknowledgement information for a second, different uplink block. In another application where the RRBP is a 2-bit data field that is invalidated for legacy terminals, one bit of the 2-bit data field includes acknowledgement information for at least two different uplink data blocks and the other bit of the 2-bit data field includes acknowledgement information for one uplink data block different than the two different uplink data blocks.

Figure 3:
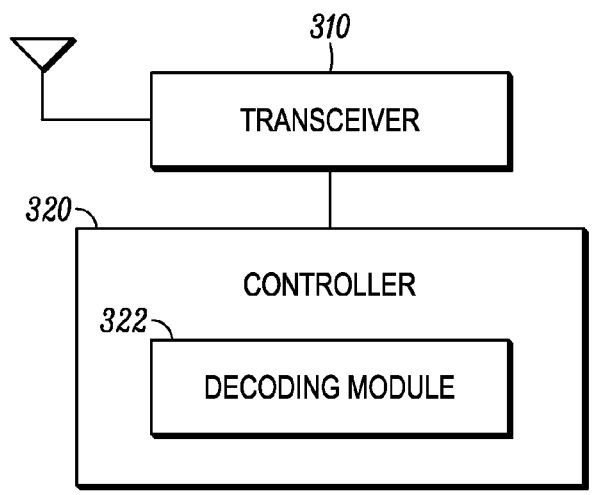
FIG. 3 is a mobile wireless communication terminal.

FIG. 3 illustrates a non-legacy mobile terminal or station 300 comprising a transceiver 310 for receiving non-scheduling information in a single block uplink scheduling field of a downlink block, for example, in an RRBP field of an RLC/MAC downlink block. The mobile station 300 includes a controller 320 communicably coupled to the transceiver. The controller includes a decoding module 322 for decoding non-scheduling information from the RRBP field. The terminal 300 also includes a user interface with inputs and outputs that are not illustrated but are well known to those having ordinary skill in the art.

In embodiments where the RRBP field is a 2-bit data field and the RRBP field is invalidated for legacy terminals, the legacy terminal may receive acknowledgement information in one bit of the 2-bit data field for a single uplink data block and acknowledgement information for a different uplink block in the other bit of the 2-bit data field. In another embodiment, one bit of the 2-bit data field includes acknowledgement information for at least two separate uplink data blocks.

Figure 4:
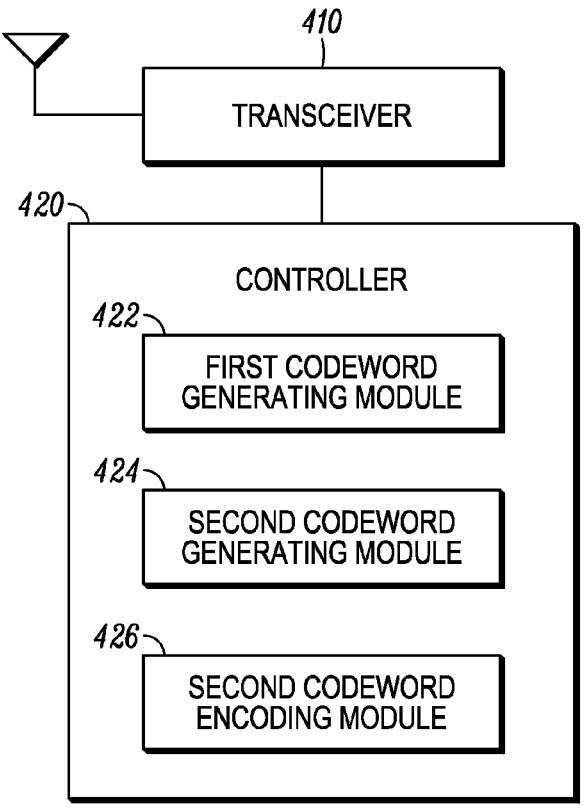
FIG. 4 illustrates a wireless communication entity.

In FIG. 4, a wireless communication entity 400, for example, a base station, packet control unit or a mobile terminal, comprises a transceiver 410 communicably coupled to a controller 420. The controller is configured to generate a first codeword from data and from an error correcting code, wherein the first codeword includes redundancy. In one embodiment, the controller includes a first codeword generating module or other logical entity 422 for generating the first codeword. The first codeword generating module may be readily implemented in software.

Figure 5:
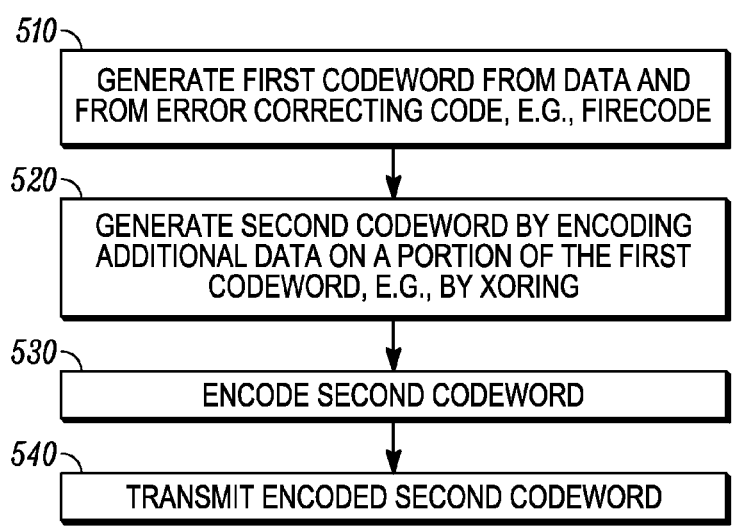
FIG. 5 is a process flow diagram.

In the process flow diagram 500 of FIG. 5, at 510, the wireless communication entity generates the first codeword from data and from an error correcting code, wherein the first codeword includes redundancy. In one embodiment the first codeword is generated by encoding the data using a cyclic redundancy code (CRC), for example, a FIRE Code. Other suitable error correcting codes include, but are not limited to, Hamming codes, Reed-Solomon codes, low density parity check codes, Bose, Ray-Chaudhuri, Hocquenghem (BCH) codes, Turbo codes, and convolutional codes, among others.

In FIG. 4, the controller is also configured to generate a second codeword by encoding additional data on a portion of the first codeword. In one embodiment, the controller includes a second codeword generating module or other logical entity 424 for generating the second codeword. The second codeword generating module may also be readily implemented in software. In one embodiment, the portion of the first codeword on which the additional data is encoded is within an error correction capability of the first codeword and particularly the error correcting code. The portion of the first code word on which the additional data is encoded may be contiguous or non-contiguous. The error correcting capability of the error correcting code is generally increased when the decoder knows which portion of the first codeword on which the additional data has been encoded.

In FIG. 5, at 520, the wireless communication entity generates the second codeword by encoding the additional data on the portion of the first codeword. In one embodiment, the second codeword is generated by X-ORing the additional data on a portion of the first codeword. In another embodiment, the second codeword is generated by replacing a portion of the first codeword with the additional data. The portion of the first codeword on which the additional data is encoded is within an error correction capability of the first codeword and particularly the error correcting code. If the decoder knows that the additional data has been encoded and on which portion of the first codeword the additional data has been encoded, the error correcting capability of the error correcting code is increased.

In one embodiment, the additional data encoded on the first code word is acknowledgement information, for example, ACK and/or NAK information. In other embodiments, more generally, however other information may be encoded on a portion of the first code word. In FIG. 4, the controller is also configured to encode the second codeword. In some applications tail bits may be added to the second codeword before encoding. The encoding of the second codeword is generally dependent upon the communication protocol in which the process is implemented. The controller includes a second codeword encoding module or other logical entity 426 for this purpose. Encoding is illustrated at 530 in FIG. 5.

In another embodiment, the second code word is formed by decoding data and encoded additional data from a codeword using a first correcting code, for example, a convolutional code or some other code. A possible additional data is hypothesized, and the hypothesized additional data is encoded onto the second codeword. The data and additional data are decoded from the second codeword using a second error correcting code, for example, a FIRE code or some other code. Errors are detected in the data and additional data using the second error correcting code, for example, the FIRE code. A single allowed remainder is produced during error detection.

In an embodiment suitable for GERAN acknowledgement applications, the first codeword is formed by encoding the data using a FIRE code, and the second codeword is formed by X-ORing acknowledgement information on a contiguous portion of the first codeword. In some GERAN applications, the second codeword is encoded with a one-half rate convolutional encoder, possibly after adding tail bits. The process of FIG. 5 is more generally applicable to encoding other additional information on a portion of a first codeword for use in other wireless communication protocols, for example, UMTS, EUTRA, WiFi, WiMAX, and 4G, among other applications. Different encoding schemes may also be used, for example, the second codeword may be encoded using a turbo code.

In some wireless communication applications that include non-legacy wireless terminals, for example, GERAN, first and second terminals may simultaneously communicate with a network infrastructure entity, for example, a base station or packet control unit, on substantially the same carrier frequency within a defined tolerance. Under some circumstances, a typical base station tolerance would be approximately 0.05 ppm of the nominal carrier frequency and a typical base terminal tolerance would be approximately 0.10 ppm of the nominal carrier frequency, though these examples are not intended to be limiting. In one embodiment, a first mobile terminal transmits a data block in a time slot to the network infrastructure entity and a second mobile terminal transmits a High Redundancy Acknowledgement Message (HRAM) comprising multiple vectors in the same time slot. According to this aspect of the disclosure, the data block and the HRAM are transmitted on substantially the same carrier frequency, the data block and the HRAM are non-orthogonal, and the data block is transmitted at a power level greater than the HRAM, thereby avoiding irreversible error at the network infrastructure entity. In one embodiment, the HRAM is confined to a portion of the time slot, for example to the midamble portion thereof.

The GERAN wireless communication network infrastructure entity thus receives a data block from the first terminal and HRAM from the second terminal in the same time slot. In one embodiment, the HRAM vector is combined with a sequence associated with a mobile station temporary block flow. in another embodiment, the HRAM vector is combined with a sequence associated with a cell in which the GSM wireless communication network infrastructure entity is located.

In GERAN applications, latency may be reduced to at least some extent by implementing one or more portions of the foregoing disclosure while maintaining interoperability with legacy GPRS and EGPRS terminals.

While the present disclosure and the best modes thereof have been described in a manner establishing possession by the inventors and enabling those of ordinary skill to make and use the same, it will be understood and appreciated that there are equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in a wireless communication network entity, the method comprising:
   encoding, at the network entity, data using a cyclic redundancy code to form a first codeword including redundancy;
   generating, at the network entity, a second codeword by X-ORing additional data on non-contiguous portions of the first codeword;
   wherein the portion of the first codeword on which the additional data is encoded is within an error correction capability of the first codeword.

2. The method of claim 1, wherein the additional data is acknowledgement information.

3. The method of claim 1, wherein the cyclic redundancy code is a FIRE code.

4. The method of claim 1 further comprising encoding the second codeword.

5. The method of claim 1, wherein generating the second codeword comprises replacing the portion of the first codeword with the additional data.

6. A wireless communication entity comprising:
   a controller configured to generate a first codeword from data and from a cyclic redundancy code, the first codeword including redundancy;
   wherein the controller is configured to generate the second codeword by X-OR-ing additional data on non-contiguous portions of the first codeword,
   wherein the non-contiguous portions of the first codeword are within an error correction capability of the first codeword.

7. The entity of claim 6, wherein the additional data is acknowledgement information.

8. The entity of claim 6, wherein the cyclic redundancy code is a FIRE code.

9. The method of claim 6, wherein generating the second codeword comprises replacing the portion of the first codeword with the additional data.

10. A method in a wireless communication network entity, the method comprising:
    encoding, at the network entity, data using a cyclic redundancy code to form a first codeword including redundancy;
    generating, at the network entity, a second codeword by X-ORing additional data on contiguous portions of the first codeword;
    wherein the contiguous portions of the first codeword on which the additional data is encoded are within an error correction capability of the first codeword.

* * * * *